(12) United States Patent
Kusagaya et al.

(10) Patent No.: US 7,671,281 B2
(45) Date of Patent: Mar. 2, 2010

(54) MULTILAYER WIRING CIRCUIT BOARD

(75) Inventors: Toshihiro Kusagaya, Kawasaki (JP);
 Yasuhiro Yoneda, Kawasaki (JP);
 Daisuke Mizutani, Kawasaki (JP);
 Kazuhiko Iijima, Kawasaki (JP); Yuji Suwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 65 days.

(21) Appl. No.: 10/254,565

(22) Filed: Sep. 26, 2002

(65) Prior Publication Data

US 2003/0063453 A1 Apr. 3, 2003

(30) Foreign Application Priority Data

Sep. 28, 2001 (JP) ............... 2001-301520
Jun. 21, 2002 (JP) ............... 2002-182048

(51) Int. Cl.
 *H05K 1/16* (2006.01)
(52) U.S. Cl. ................... 174/260; 174/255
(58) Field of Classification Search ........... 174/255, 174/260, 261, 262, 263, 264, 265, 266; 361/792, 361/795, 794, 311, 306.11, 308.11
See application file for complete search history.

(56) References Cited

U.S. PATENT DOCUMENTS

| | | | | |
|---|---|---|---|---|
| 4,258,468 A | * | 3/1981 | Balde ................... | 29/830 |
| 4,464,704 A | * | 8/1984 | Huie et al. ............. | 361/792 |
| 5,010,641 A | * | 4/1991 | Sisler .................. | 29/830 |
| 5,079,069 A | | 1/1992 | Howard et al. | |
| 5,117,068 A | * | 5/1992 | Seieroe et al. ......... | 174/52.4 |
| 5,155,655 A | | 10/1992 | Howard et al. | |
| 5,161,086 A | | 11/1992 | Howard et al. | |
| 5,177,670 A | * | 1/1993 | Shinohara et al. ...... | 361/738 |
| 5,495,665 A | * | 3/1996 | Carpenter et al. ...... | 29/830 |
| 5,590,017 A | * | 12/1996 | Kelso ................. | 361/321.4 |
| 5,734,198 A | * | 3/1998 | Stave ................. | 257/666 |
| 5,764,491 A | | 6/1998 | Tran | |
| 5,838,549 A | * | 11/1998 | Nagata et al. ......... | 361/794 |
| 6,229,095 B1 | | 5/2001 | Kobayashi | |
| 6,366,466 B1 | * | 4/2002 | Leddige et al. ........ | 361/760 |

(Continued)

FOREIGN PATENT DOCUMENTS

JP 5-500136 1/1993

(Continued)

OTHER PUBLICATIONS

Office Action JP 2002-182048 dated Jan. 16, 2007.

*Primary Examiner*—Ishwarbhai B Patel
(74) *Attorney, Agent, or Firm*—Westerman, Hattori, Daniels & Adrian, LLP

(57) ABSTRACT

An inexpensive multilayer wiring circuit board capable of conducting high frequency switching operation on the circuit while the generation of high frequency noise is being suppressed by reducing the inductance of the circuit in provided. A multilayer wiring circuit board with an uppermost layer designated as a first layer on which parts are mounted; a second layer on which one of a ground layer and an electric power source layer is arranged; a third layer on which the other is arranged; and an insulating layer arranged between the ground layer and the electric power source layer. A resin layer having a thermoplastic adhesion property on both faces is used as material of the insulating layer arranged between the electric power source layer and the ground layer.

9 Claims, 12 Drawing Sheets

U.S. PATENT DOCUMENTS

| | | | |
|---|---|---|---|
| 6,373,717 B1 * | 4/2002 | Downes et al. | 361/795 |
| 6,400,576 B1 * | 6/2002 | Davidson | 361/763 |
| 6,417,460 B1 * | 7/2002 | Cheng | 174/255 |
| 6,559,536 B1 * | 5/2003 | Katoh et al. | 257/712 |
| 6,625,857 B2 * | 9/2003 | Appelt et al. | 29/25.42 |
| 6,657,849 B1 * | 12/2003 | Andresakis et al. | 361/311 |
| 2001/0024360 A1 | 9/2001 | Hirata et al. | |
| 2002/0086171 A1 * | 7/2002 | Sakayori | 428/458 |

FOREIGN PATENT DOCUMENTS

| | | |
|---|---|---|
| JP | 406037515 A * | 2/1994 |
| JP | 8-88318 A | 4/1996 |
| JP | 11-68319 A | 3/1999 |
| JP | 2000-022287 | 1/2000 |

* cited by examiner

MULTILAYER WIRING CIRCUIT BOARD

BACKGROUND OF THE INVENTION

1. Field of the Invention

The present invention relates to a multilayer wiring circuit board used for various electronic equipment and communication equipment. More particularly, the present invention relates to a multilayer wiring circuit board capable of reducing the characteristic impedance in a high frequency region. This invention also relate to a method of producing such a multilayer wiring circuit board.

2. Description of the Related Art

In order to remove noise, the frequency of which is in a band from 100 to 200 MHz, which is generated by an electric power source when switching is conducted on a circuit, it is conventional that a bypass condenser, which is arranged between the electric power source and the ground, is mounted on a circuit board so that the characteristic impedance can be reduced by increasing the capacitance of the circuit.

However, according to the above method by which the characteristic impedance is reduced by mounting the condenser on the circuit board so as to increase the capacitance, the number of the condensers to be mounted is increased when the circuit structure is made to be fine and the circuit density is increased to be high. Therefore, it is difficult to make the circuit structure fine so as to increase the circuit density by the above conventional method.

In order to solve the above problem, there is provided a method in which a condenser for removing high frequency noise, which is generated by the electric power source, is formed on the multilayer wiring circuit board.

For example, Japanese Unexamined Patent Publication No. 5-500136 discloses a multilayer wiring circuit board into which a condenser lamination body is incorporated so that an excellent capacitance characteristic can be obtained with respect to a plurality of parts which are operated at random.

Recently, there is a tendency that the switching frequency of the circuit is more increased. When the switching frequency of the circuit is increased more than a predetermined value, it becomes impossible to remove the high frequency noise even if the above conventional circuit structure is adopted.

This is related to the circuit inductance.

SUMMARY OF THE INVENTION

It is a task of the present invention to solve the above problems.

Accordingly, it is an object of the present invention to provide an inexpensive multilayer wiring circuit board capable of conducting high frequency switching operation on the circuit while the generation of high frequency noise is being suppressed by reducing the inductance of the circuit.

It is another object of the present invention to provide a multilayer wiring circuit board on which the generation of high frequency noise, which is generated by an electric power source when switching is conducted on the circuit, is reduced by reducing a distance between the electric power source layer and the mounting parts and also by reducing a distance between the ground electrode and the mounting parts.

In order to solve the above problems, the present inventors have made investigation in good earnest. As a result of the investigation, the present invention has been accomplished as follows. In order to reduce the generation of high frequency noise by an electronic circuit, a wiring distance between the electric power source and the mounting parts and also a wiring distance between the ground electrode and the mounting parts are minimized so that the circuit inductance between the electric power source and the mounting parts and also between the ground electrode and the mounting parts can be reduced, and further a sectional area of a connection via is optimized. Furthermore, the present inventors have found that the above multilayer wiring circuit board can be produced by the process of producing a conventional printed wiring board.

According to the present invention, there is provided a multilayer wiring circuit board comprising: an uppermost layer designated as a first layer on which parts are mounted; a second layer on which one of a ground layer and an electric power source layer is arranged; a third layer on which the other of the ground layer and the electric power source layer is arranged; an insulating layer arranged between the ground layer and the electric power source layer; and said first layer, said second layer, said insulating layer and said third layer are laminated together.

According to the present invention, the wiring distances among the electric power source, mounting parts and ground electrode can be minimized, so that it becomes possible to reduce the inductance of the circuit. Therefore, it is possible to provide a multilayer wiring circuit board which does not need a condenser conventionally used for removing high frequency noise generated by the electric power source when switching operation of the circuit is conducted. In this case, the multilayer wiring circuit board can be provided by the same production process as that of a conventional printed wiring board.

A resin layer having a thermoplastic adhesion property on both faces can be used as material of the insulating layer arranged between the electric power source layer and the ground layer. The insulating layer arranged between the electric power source layer and ground layer may be an insulating film, and the insulating film may be a polyimide film having a thermoplastic adhesion property on both faces.

The insulating layer arranged between the electric power source layer and ground layer may be made of a material on which a patterning process can conducted. The insulating layer arranged between the electric power source layer and ground layer may be an insulating film, and the insulating film may be a resin film on which laser beam patterning can be conducted.

Wherein the uppermost layer and electric power source layer may be connected with each other by embedded vias and also the uppermost layer and ground layer may be connected with each other by embedded vias.

No signal layers are arranged on the first layer, which is the uppermost layer, and on the second and the third layer which are respectively one and the other of the ground layer and electric power source layer, and the signal layer is arranged on the fourth layer and more.

The thickness of the insulating film arranged between the ground layer and electric power source layer is small and not more than 30 μm.

The surface build-up layer arranged between the first layer, which is a part mounting layer, and the second layer may be a prepreg layer of 80 μm thickness to which laser beam machining can be conducted.

Embedded vias are formed so as to extend in a thickness direction perpendicular to the direction of the layer of the board between the first layer, which is a part mounting layer, and the ground layer and also between the first layer, which is the part mounting layer, and the electric power source layer.

The surface build-up layer arranged between the first and the second layer is a solder resist layer.

The thickness of the solder resist layer is approximately 20 μm.

Portions of the solder resist layer, in which parts are mounted, are open and the conductive pattern formed on the second layer is exposed outside.

One portion of the conductor pattern formed on the second layer is one of the ground layer and electric power source layer, and another portion of the conductor pattern formed on the second layer is connected with the other of the ground layer and electric power source layer through embedded vias extending in the thickness direction perpendicular to the direction of the layer of the board.

A sectional area of the embedded via is made to be relatively large so as to reduce the inductance. The multilayer wiring circuit board may be composed of a plurality of layers, the number of which is not less than eight.

According to another aspect of the present invention, there is provided a multilayer wiring circuit board comprising: a circuit board composed of a plurality of layers which have previously been produced; and a condenser lamination body, which is arranged as the closest layer to one face of the circuit board on which parts are arranged, wherein an insulating layer is arranged between the ground layer and electric power source layer.

According to stile another aspect of the present invention, there is provided a method of producing a multilayer wiring circuit board comprising the steps of:

laminating the other face side of a first insulating film, on one face of which a first conductive foil layer is formed, on the other face of which a first conductive pattern is formed, on a wiring circuit board through an insulating adhesion film;

patterning the first conductive foil layer so as to provide a second conductive pattern;

laminating a second insulating film on one of the faces of the first insulating film and also laminating a second conductive foil layer on the second insulating film;

forming a first hole by penetrating the second conductive foil layer and the second insulating film so that the first hole is exposed to the second conductive pattern, also forming a second hole by penetrating the second conductive foil layer, the second insulating film and the first insulating film so that second hole is exposed to the first conductive pattern, and also forming a third conductor pattern by patterning the second conductive foil layer; and embedding conductive vias in the first and the second hole, and electrically connecting the conductive vias with the third conductive pattern, which is a surface layer, wherein one of the first and the second conductive pattern is made to be a ground layer and the other is made to be an electric power source layer.

The first and the second hole may be formed by laser beam machining.

DETAILED DESCRIPTION OF THE PREFERRED EMBODIMENTS

Referring to the accompanying drawings, an embodiment of the present invention will be explained below in detail.

Figure 1:
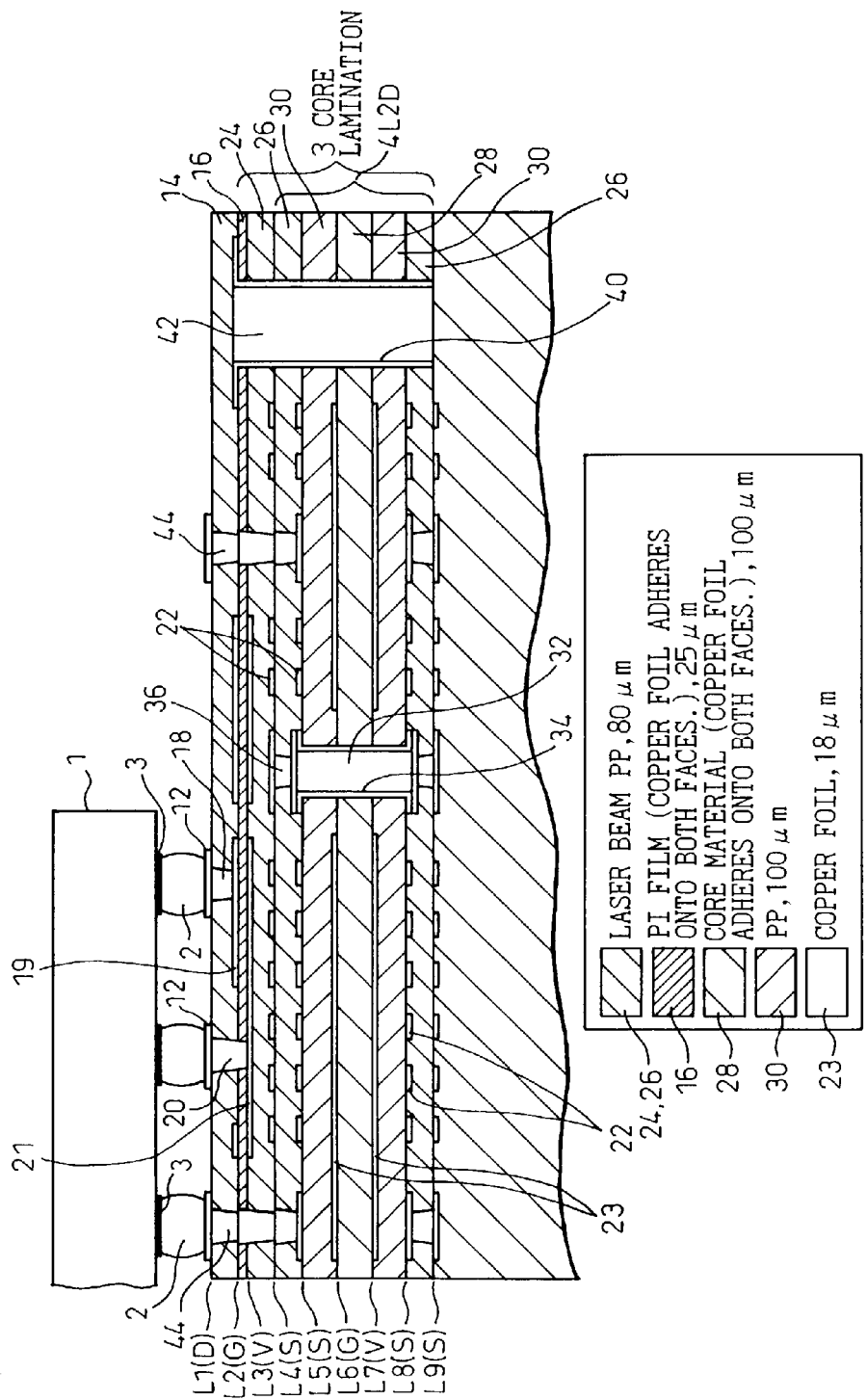
FIG. 1 is a sectional view of the first embodiment of the multilayer wiring circuit board of the present invention.

FIG. 1 is a sectional view showing an embodiment of the multilayer wiring circuit board of the present invention.

On the uppermost surface of the multilayer wiring circuit board of the present invention, there are provided conductive patterns, which are used for mounting electronic parts such as a semiconductor chip 1, and conductive pads 12. Concerning the semiconductor chip 1, it is possible to mount any of the bare chip, the ball grid array (BGA) type chip having bumps of the surface mounting type, the LGA type chip having no bumps and the parts of QFA type having leads.

In FIG. 1, as an example, there is shown a semiconductor chip 10 of the ball grid array (BGA) having the solder bumps 2.

The electrode pads 3 of the semiconductor chip 1 are connected with the conductor pads 12 on the multilayer wiring circuit board through the solder bumps 2.

The second layer L2 is formed as a ground layer. The third layer L3 is formed as an electric power source layer. On the contrary, the second layer L2 may be formed as an electric power source layer, and the third layer L3 may be formed as a ground layer. In this case, explanations will be into a case in which the second layer L2 is formed as a ground layer and the third layer L3 is formed as an electric power source layer.

Between the uppermost surface layer L1 and the ground layer L2, there is provided an insulating film 14 as a surface layer, that is, there is provided a resin film on which laser beam patterning can be conducted, for example, there is provided a layer of prepreg. It is preferable that the thickness of this layer is small, however, it is common that the thickness of this layer is 30 to 40 μm. In this connection, this insulating film 14 is subjected to laser beam patterning. Further, this insulating film 14 may be subjected to a well known machining method such as drilling, punching and exposure developing.

It is preferable that the insulating film 14 is made of thermoplastic resin having an adhesive property. Specific examples of the usable resin are: polybenzo oxazole, polyether etherketon and epoxy resin. Further, it is possible to use resin in which inorganic filler is mixed.

Concerning the material of the insulating film 16 provided between the ground layer L2 and the electric power source layer L3, it is preferable to use a polyimide film, both faces of which have a thermoplastic adhesive property. An example of the insulating film 16 is a polyimide film, on which laser beam patterning can be conducted, the thickness of which is 15 μm.

In the through-hole, which penetrates the first layer L1 of the uppermost surface layer and the second layer L2, onto which the ground pattern 19 is exposed, the conductive via 18 is filled, so that the ground layer L2 and the connection pad 12 for ground use on the uppermost surface layer L1 can be connected with each other. The above through-hole is formed by drilling such as laser beam machining conducted on the surface build-up layer 14. When plating is conducted inside the through-hole, the conductive via 18 can be formed.

In the same manner as that described above, the through-hole penetrating between the first layer L1, which is the uppermost surface layer, and the third layer L3, onto which the electric power source pattern 21 is exposed, is filled with the conductive via 20, so that the electric power source pattern 21 of the electric power source layer L3 and the electric power source connection pad 12 on the uppermost surface layer L1 are connected with each other. In the same manner as that described above, this through-hole is formed in such a manner that drilling is conducted by means of laser beam machining on the surface build-up layer 14 and the polyimide film 16 in the thickness direction, and then plating is conducted on the through-hole so that the conductive via 20 can be formed.

The signal patterns 22 are respectively arranged on the fourth layer L4 and the fifth layer L5. The insulating films 24, 26, which are respectively arranged between the electric power source layer L3 of the third layer and the fourth layer and also between the fourth layer and the fifth layer, are made of a resin film capable of being machined by laser beam patterning, for example, the insulating films 24, 26 are prepreg layers, and the thickness is approximately 80 μm.

The sixth layer L6 and the seventh layer L7 are layers to which copper foil adheres. That is, copper foil is made to adhere onto both faces of the sixth layer L6 and the seventh layer L7 except for the positions where the through-holes are formed. The core material 28 is a layer of hardened prepreg, the thickness of which is usually about 100 μm. The thickness of the copper foil 23 formed on both faces (L6, L7) of the core material 28 is usually about 18 μm.

Between the fifth layer L5 and the sixth layer L6 and also between the seventh layer L7 and the eighth layer L8, there is provided a layer 30 of prepreg, the thickness of which is approximately 100 μm.

The eighth layer L8, the ninth layer L9 . . . are arranged being symmetrical to the fifth layer L5, the fourth layer L4 . . . upward and downward in the thickness direction. In the same manner as that of the fourth layer L4 and the fifth layer L5, a large number of signal patterns 22 are arranged on the eighth layer L8, the ninth layer L9 . . .

There is provided a through-hole 32 penetrating between the fifth layer L5 and the eighth layer L8. Copper plating 34 is conducted inside the through-hole 32. In this through-hole 32, the copper foil layers 23 on the sixth layer L6 and the seventh layer L7 are not arranged. That is, the through-hole 32 penetrates the opening portions of these copper foil layers.

At a position between the fourth layer L4 and the fifth layer L5 coinciding with the position of the through-hole 32, there is provided a through-hole. In this through-hole, the conductive via 36 is formed, so that the layers are electrically connected with each other. Accordingly, the fourth layer L4, which is a signal layer, and the ninth layer L9, which is a signal layer in the same manner, are connected with each other.

There are provided through-holes which respectively penetrate between the first layer L1, which is the uppermost layer, and the second layer L2 and also between the second layer L2 and the fourth layer L4 and also between the fourth layer L4 and the fifth layer L5. Positions of these through-holes are aligned with each other in the thickness direction, and the through-holes are filled with the conductive vias 44. Due to the foregoing, the uppermost surface layer L1 and the fifth layer L5, which is a signal layer, are electrically connected with each other.

Except for the surface build-up layer 14 arranged between the first layer L1, which is the uppermost layer, and the second layer L2, the through-hole 40 penetrates the multilayer wiring circuit board in the thickness direction. Plating is conducted inside this through-hole 40, and conductive via 42 is formed inside the through-hole 40, so that the layers can be electrically connected with each other.

In this connection, on this multilayer wiring board, it is preferable that a distance between layer L1 and layer L2 is shorter than a distance between layer L3 and layer L4.

Next, referring to FIGS. 2 to 8, a method of producing the multilayer wiring circuit board of the present invention will be explained below.

Figure 2:
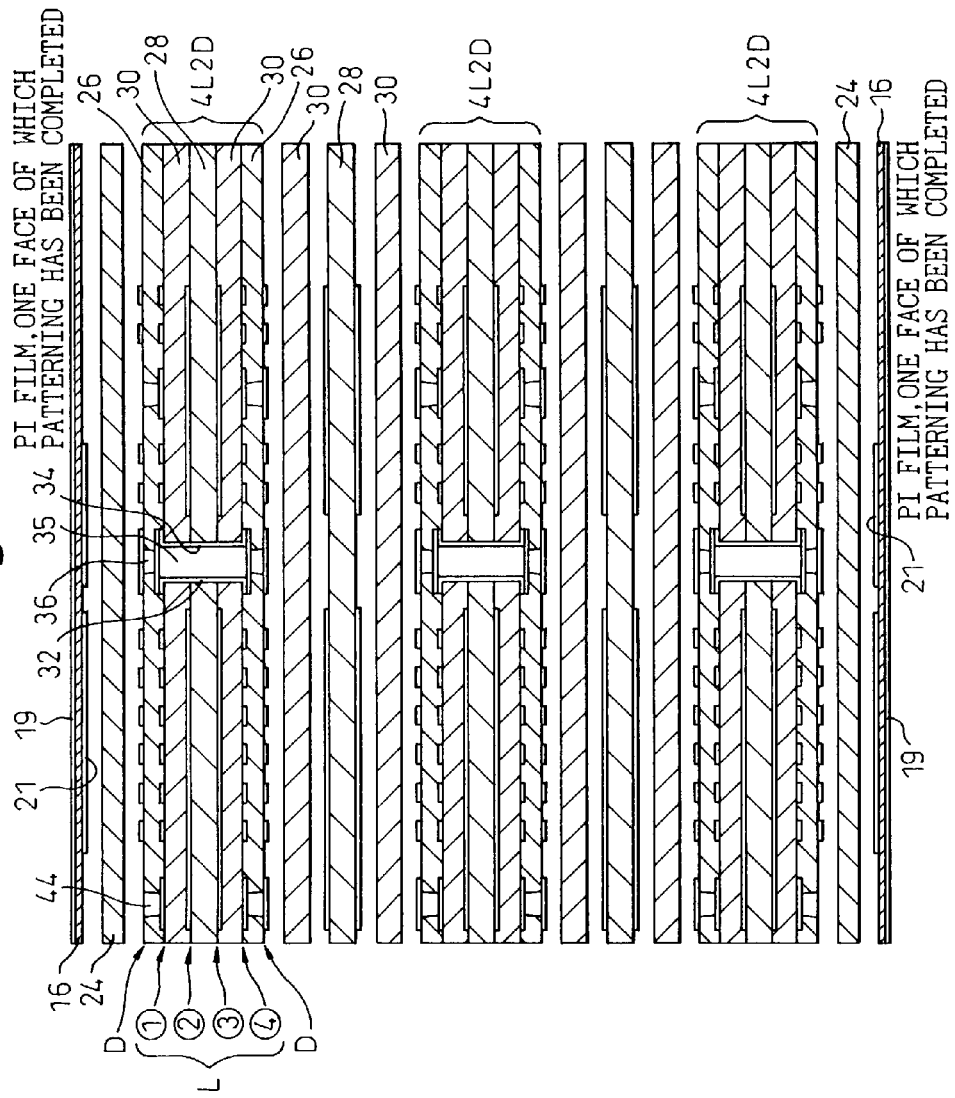
FIG. 2 is a sectional view showing a production process of the multilayer wiring circuit board of the present invention, wherein the view shows a state before lamination.

First, several multilayer circuit boards, which are called 4L2D, are prepared. This, 4L2D is composed of four layers of lamination (4L) arranged at the center and two layers of deposit (2D) arranged on the front and the reverse side. This multilayer circuit board 4L2D is formed symmetrically with respect to the thickness direction. In FIG. 2, the central four layers (4L) are referred to as the first layer (1), second layer (2), third layer (3) and fourth layer (4) from above. Then, between the second layer and the third layer which are arranged at the center, there is provided a core material 28, on both faces of which copper foil is formed. This core material 28 is made of hardened prepreg described before, and the thickness is approximately 100 μm.

Copper foil is made to adhere to the entire faces of both faces of the core material 28, that is, copper foil is made to adhere to the entire faces of the second and the third layer except for the portions in which the through-hole 32 are formed. The thickness of this copper foil is approximately 18 μm. Between the first layer and the second layer of 4L and also between the third layer and the fourth layer, there is provided a layer of prepreg 30, the thickness of which is approximately 100 μm. The first and the fourth layer, which are the front and the reverse face of 4L, are copper wiring layers which are patterned. These layers compose the signal layers 22 of the multilayer wiring circuit board. On 4L, there is provided a through-hole 32 penetrating in the thickness direction. Inside the through-hole 32, through-hole plating 34 is conducted, and the through-hole 32 is filled with conductive paste, so that the conductive via 35 is charged.

Between the front and the reverse deposit (2D) layer of 4L2D and the first and the fourth layer of 4L, there is provided a layer of the prepreg 30 of about 80 μm thickness which can be machined by means of laser beam machining. That is, on the upper and the lower face of 4L, the prepreg layer 30 of about 80 μm thickness is laminated. After the completion of lamination, the through-hoe 32 is formed. The through-hole 36 is formed at a position aligning with the through-hole 32 penetrating 4L, and the through-hole 36 is communicated with the through-hole 32. The other through-hole 44 is connected with only the copper land pattern of the first layer or the forth layer. On the first and the fourth layer of 2D, copper foil is patterned. The first and the fourth layer of 2D become the signal layers 22.

In the first process shown in FIG. 2, between a plurality of 4L2D which are multilayer wiring circuit boards formed in this way, the core material 28 of about 100 μm thickness, on both faces of which copper foil is made to adhere, is arranged at the center. The prepreg layers 30 of about 100 μm thickness are arranged on both sides of this core material 28. At the lowermost and the uppermost portion of the laminated body, the polyimide film 16, on both faces of which copper foil is made to adhere, only one face of which has been previously patterned, is arranged through the prepreg layer 24 which can be subjected to laser beam machining in such a manner that the patterned face (electric power source layer) is set inside.

In this case, the thickness of the core material 28, on both faces of which copper foil is made to adhere, is approximately 100 μm. Except for the positions at which the through-holes 32 are formed, copper foil is made to adhere onto the entire upper and lower faces of the core material 28. The thickness of the prepreg layers 30 arranged on both faces of the core material 28 is approximately 100 μm. The thickness of the prepreg layers 24, which can be subjected to laser beam machining, which are laminated in the uppermost and the lowermost portion of the laminated body, is approximately 80 μm. The thickness of the polyimide film 16, on both faces of which copper foil is made to adhere, only one face of which is patterned, is approximately 25 μm.

Figure 3:
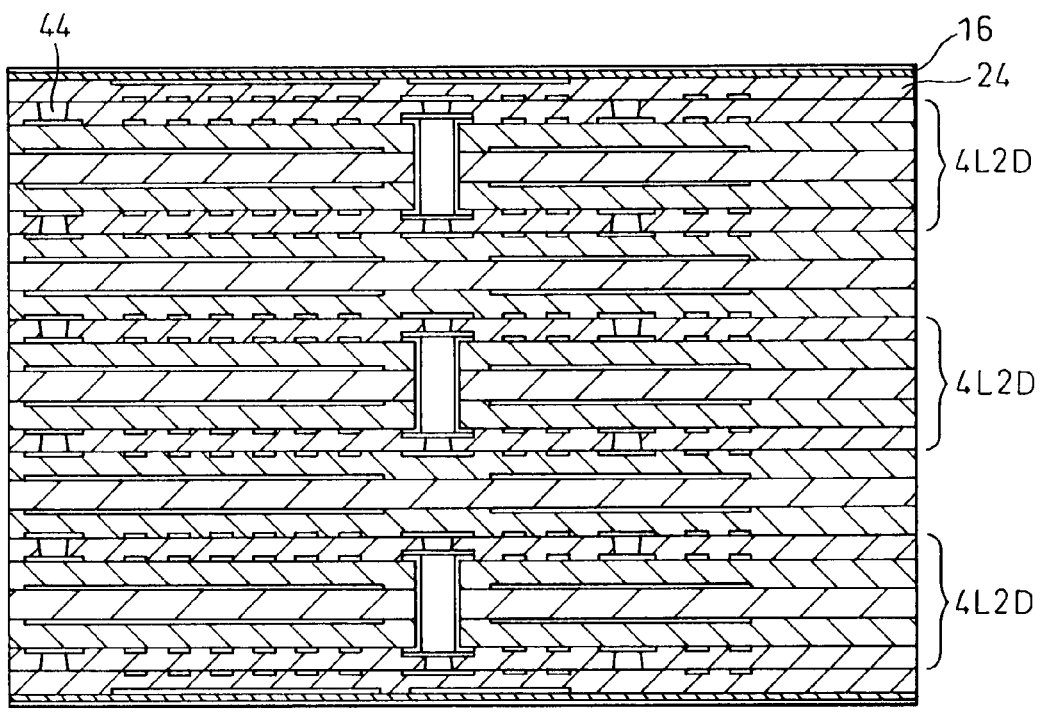
FIG. 3 is a sectional view showing a production process of the multilayer wiring circuit board of the present invention, wherein the view shows a state after lamination.

The state of lamination is shown in FIG. 3.

Figure 4:
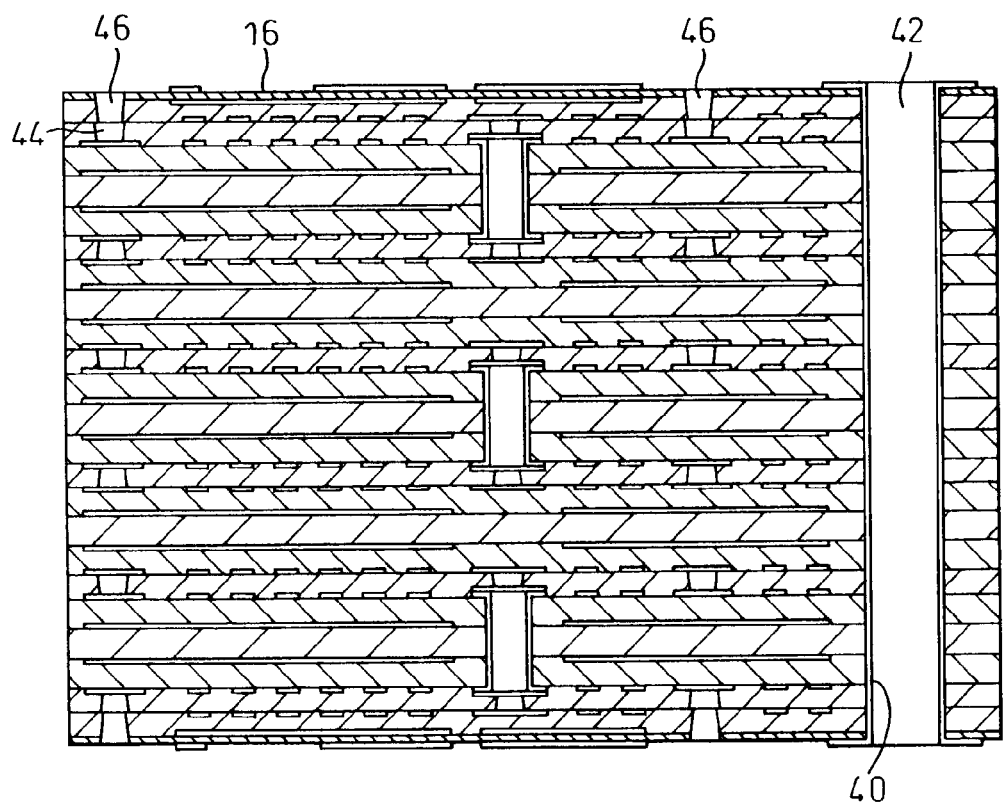
FIG. 4 is a sectional view showing a production process of the multilayer wiring circuit board of the present invention, wherein the view shows a state of laser beam machining, drilling and plating conducted after lamination.

Next, as shown in FIG. 4, laser beam machining, drilling and plating are conducted on the thus laminated multilayer wiring circuit board. Patterning is conducted on copper foil formed on the entire outer faces of the polyimide films 16 provided on the front and the reverse face of the laminated body, that is, the ground layer is formed. Further, the through-holes 46 are formed by means of laser beam machining. These through-holes 44 are formed at positions coinciding with the positions at which the through-holes 44 exposed to the surface of 4L2D are formed. These through-holes 44 are connected with the through-holes 44. Further, the through-holes 42, which penetrate the laminated multilayer wiring circuit board in the thickness direction, are formed by means of drilling. Through-hole plating 40 is conducted on the inner faces of these through-holes 42.

Figure 5:
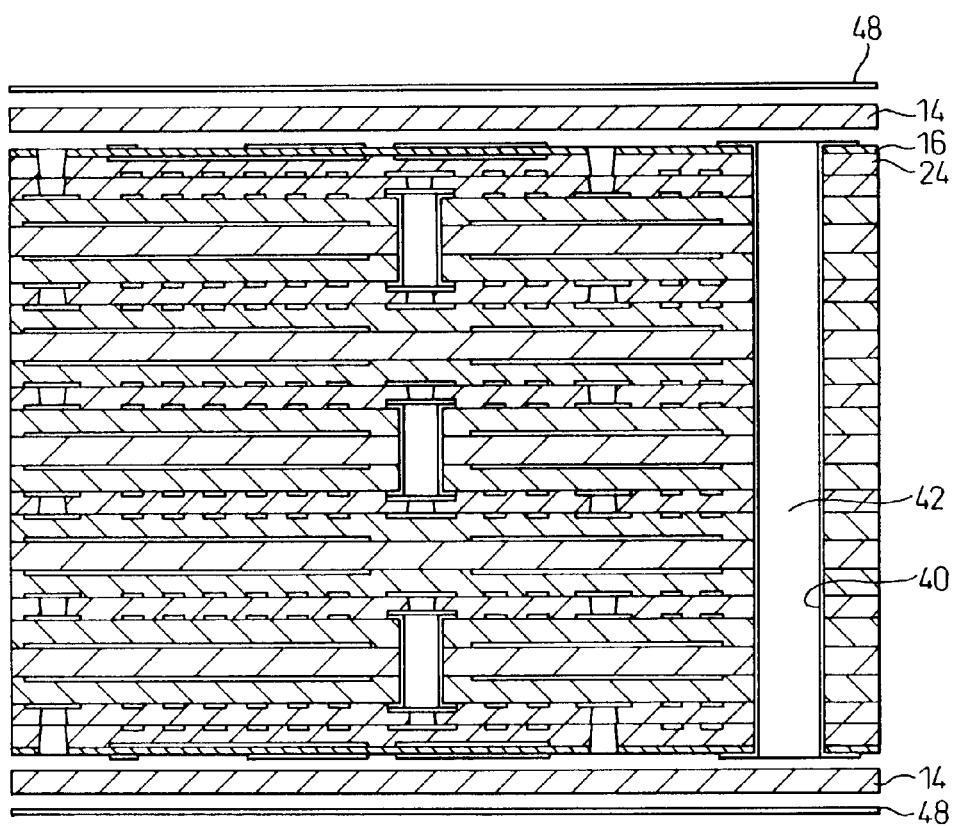
FIG. 5 is a sectional view showing a production process of the multilayer wiring circuit board of the present invention, wherein the view shows a state of a surface built-up layer before lamination.

Next, as shown in FIG. 5, the surface build-up layers 14 are laminated on the uppermost surface and the lowermost surface of the laminated body. That is, the prepreg layer of about 80 μm thickens, which can be machined by means of laser beam machining is laminated, and the copper foil layer 48 of about 18 μm thickens is laminated on it.

Figure 6:
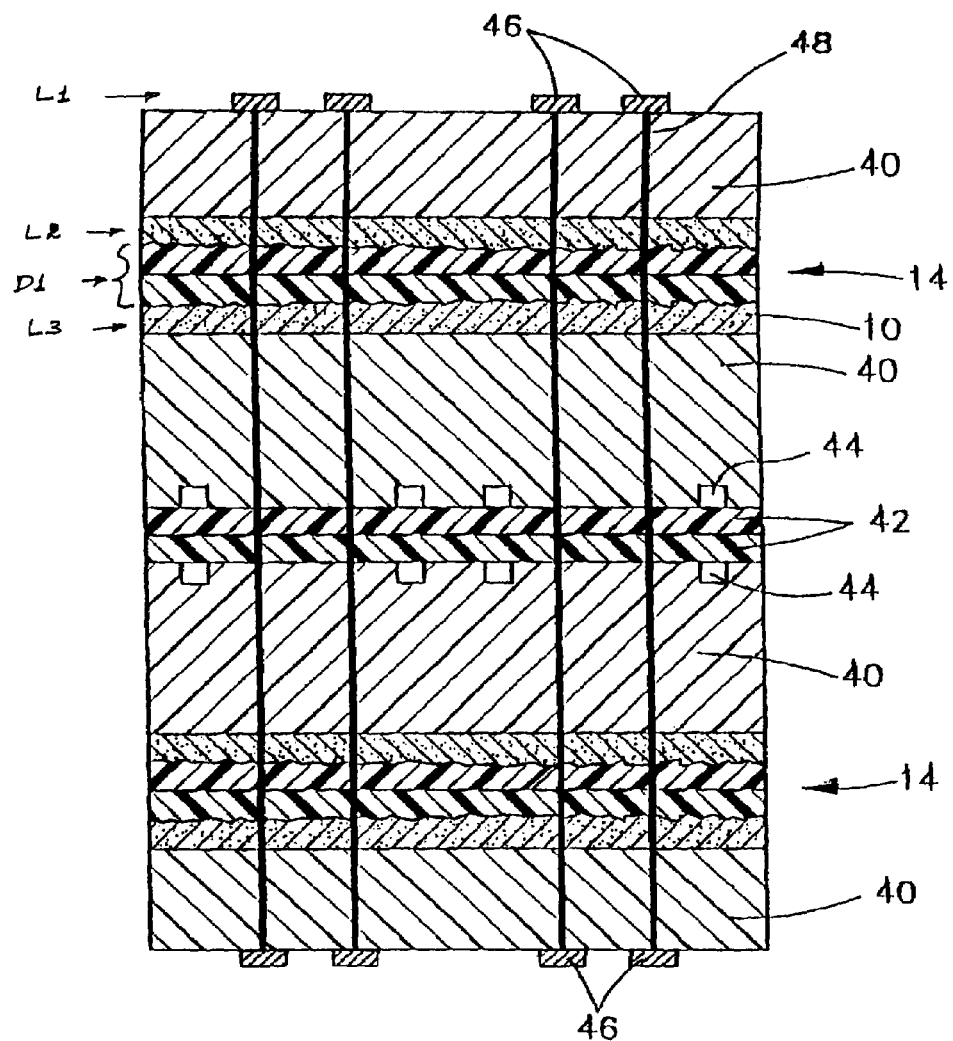
FIG. 6 is a sectional view showing a production process of the multilayer wiring circuit board of the present invention, wherein the view shows a state of laser beam machining and plating after a surface built-up layer is laminated.

The state of lamination is shown in FIG. 6.

Next, the laminated multilayer wiring circuit board is subjected to laser beam machining and plating. That is, patterning is conducted on the copper foil layer 48, on which the necessary through-holes are formed, which is formed on the prepreg layer 14 on which laser beam machining can be conducted. In other words, the parts mounting face pattern is formed. These through-holes are classified into the following three types. (1) The through-holes 18 (shown in FIG. 1) penetrating from the surface only to the prepreg layer 14 and exposed to the outer pattern (ground layer) 19 of the polyimide film 16. (2) The through-holes 20 (shown in FIG. 1) penetrating from the surface to the prepreg layer 14 and the polyimide film 16 and exposed to the pattern (electric power source layer) 21 on the inner face of the polyimide film 16. (3) The through-holes 44 (shown in FIG. 1) penetrating from the surface to the prepreg layer 14 and the polyimide film 16 and exposed to the conductive body filled in the inside through-holes.

In the formation of the parts mounting face pattern, lands and others are formed for mounting parts such as semiconductor elements. In this case, the land 12 is formed which is connected with the vias 18, 20 embedded on the electric power source layer and the ground layer, and further the land 12 is formed which is connected with the signal pattern 22 and also connected with the vias on the uppermost layer connected between the vias over a plurality of layers.

Figure 7:
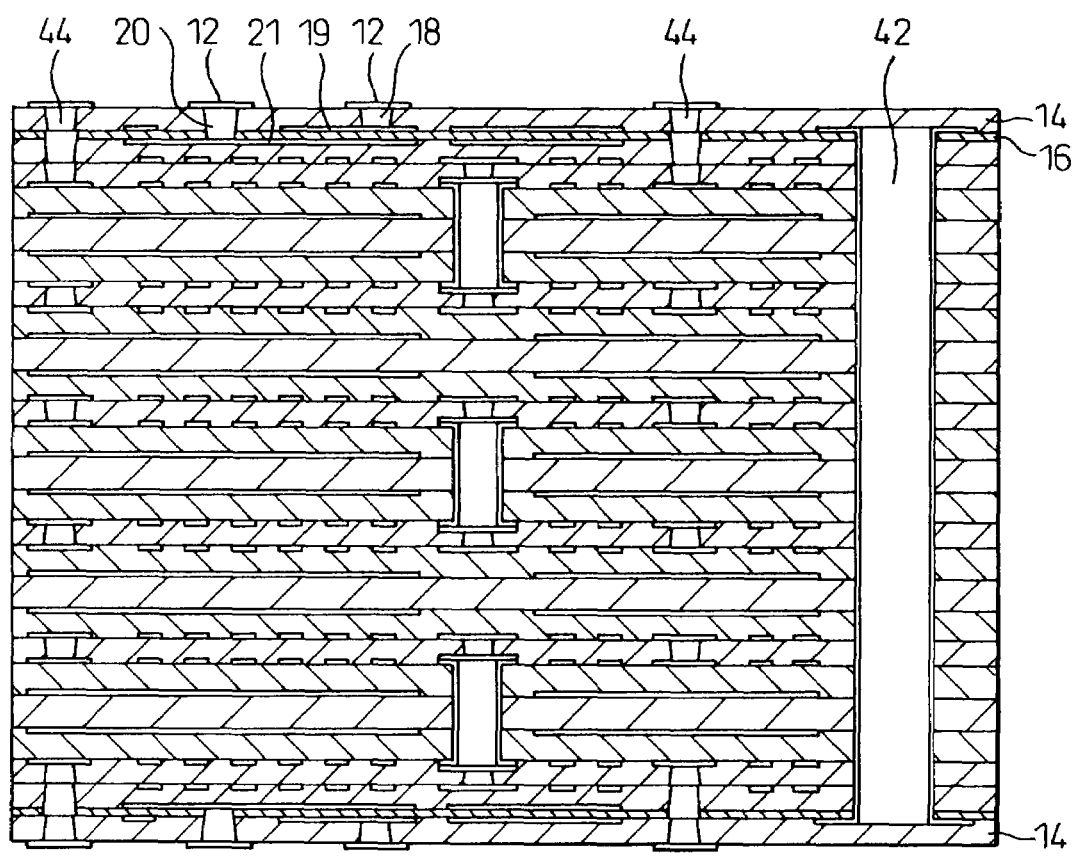
FIG. 7 is a sectional view showing a state of completion of the multilayer wiring circuit board of the present invention.

As shown in FIG. 7, the uppermost surface layer of the multilayer wiring board, which is a completed lamination body, prescribes a mounting face of the semiconductor parts. As described before, the parts to be mounted may be a bare chip, a ball grid array (BGA) type chip having bumps of the surface mounting type, a chip of LGA type having no bumps or a QFP type chip having leads.

In the present invention, one of the faces of the patterned copper wiring patterns 19, 21 formed on both faces of the polyimide film 16 forms a ground layer, and the other face forms an electric power source layer. Due to the foregoing, both the ground layer and the electric power source layer can be arranged at positions closest to the parts to be mounted in the thickness direction of the multilayer wiring circuit board as compared with the signal layer. Due to the above structure, it is possible to reduce the inductance of the circuit. Therefore, it becomes possible to reduce the noise generated in the high frequency region.

In this connection, either face of the copper wiring patterns 19, 21 on both faces of the polyimide film 16 may be an electric power source layer or a ground layer.

Figure 8:
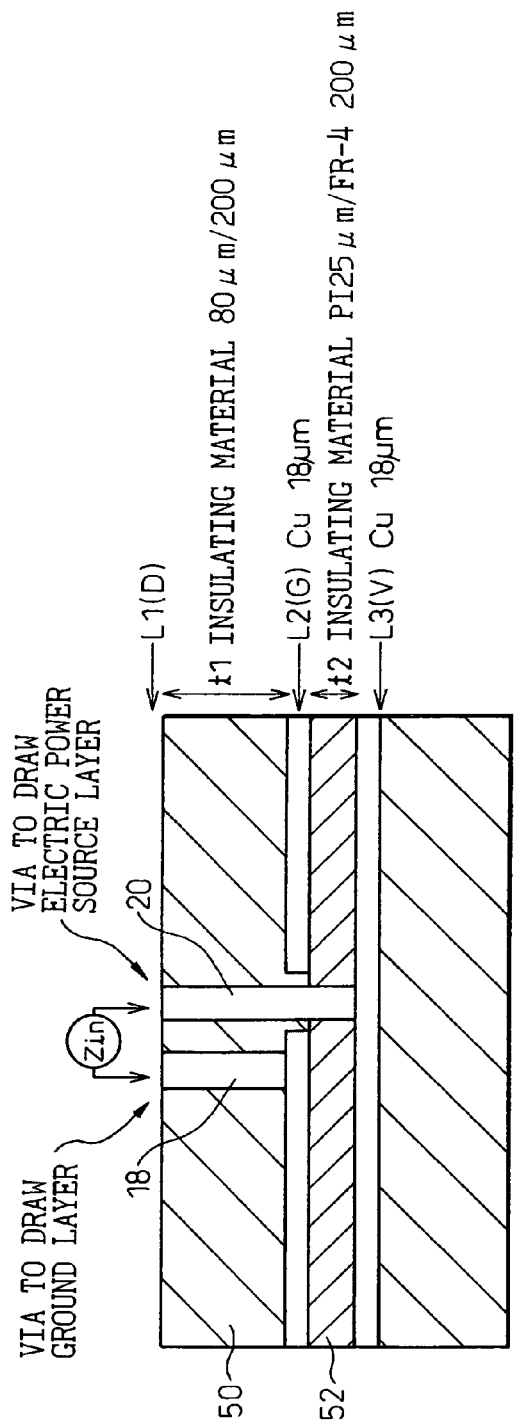
FIG. 8 is a sectional view of the board in the case where simulation of calculating the impedance is conducted so as to show the characteristic of the present invention.
Figure 9:
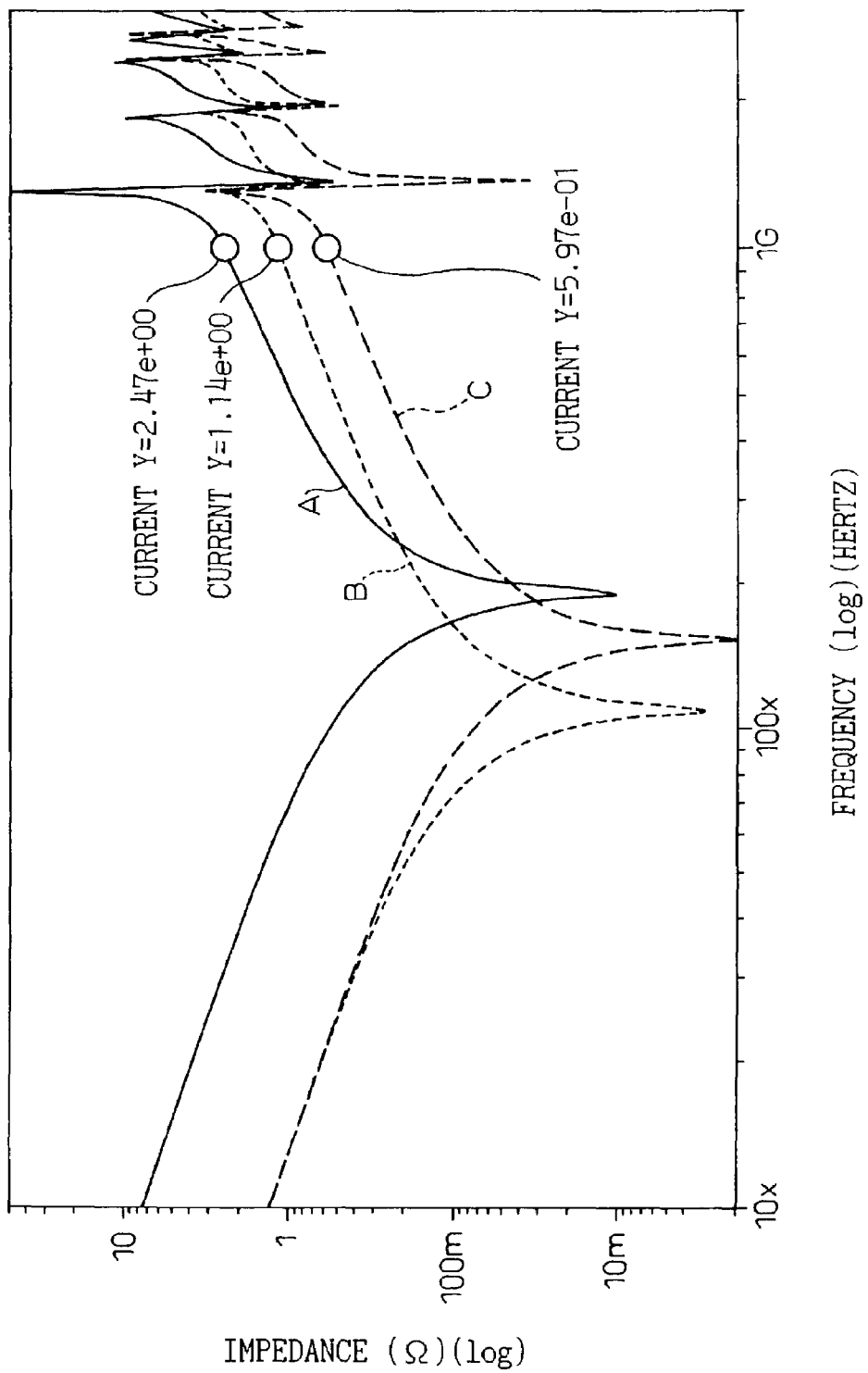
FIG. 9 is a view showing the result of simulation of calculating the impedance.

FIGS. 8 and 9 are illustrations showing the result of verification of a simulation test made for proving the characteristic of the multilayer wiring circuit board of the present invention. FIG. 8 is a sectional view of the board, the impedance of which was calculated by the simulation test, and FIG. 9 shows the result of analysis.

In FIG. 8, L1 is a surface layer on which parts are mounted, L2 is a ground layer, and L3 is an electric power source layer. However, neither the conductive pattern nor the conductive land is formed on the surface layer L1. Both the ground layer L2 and the electric power source layer L3 are copper patterns, and the thickness is 18 μm. Between the surface layer and the ground layer L2, there is provided an insulating material layer 50, the thickness t1 of which is set at 80 μm in one case, and the thickness t1 of which is set at 200 μm in the other case. Between the ground layer L2 and the electric power source layer L3, there is provide an insulating material layer 52, which is a polyimide layer of 25 μm thickness (t2) in one case and which is a layer of FR-4 of 200 μm thickness (t2) in the other case.

There are provided through-holes penetrating the insulating material from the surface layer L1 to the ground layer L2 in the thickness direction. In the through-holes, the conductive vias 18 are charged and exposed onto the surface layer. In the same manner, there are provided through-holes penetrating the insulating material layers 50 and 52 from the surface layer L1 to the electric power source layer L3 in the thickness direction. In these through-holes, the conductive vias 18 are charged and exposed onto the surface layer. Of course, there is provided no ground layer in the portions of the through-holes (conductive vias 20) extending to the electric power source layer L3.

In this connection, the conditions of analysis are described as follows. The size of the entire board was 100 mm×100 mm, and the analysis of impedance was calculated in a portion close to the center of the board.

The impedance was measured according to the frequency between the conductive vias 18 for drawing the ground layer, which was exposed to the surface layer, and the conductive vias 20 for drawing the electric power source layer.

As an object to be inspected, the following three types of sample boards of the insulating material layers 50 and 52 of different thickness (t1, t2) were prepared.

Sample A: t1/t2=200 µm/200 µm,
Sample B: t1/t2=200 µm/25 µm,
Sample C: t1/t2=80 µm/25 µm.

In FIG. 9, the axis of abscissa represents frequency (Hz), and the axis of ordinate represents impedance (Ω).

In the case of the board of sample A, the thickness (t1) of the insulating material layer 50 provided between the surface layer L1 and the ground layer L2 is 200 µm, that is, the thickness (t1) of the insulating material layer 50 is large, and the thickness (t2) of the insulating material layer 52 provided between the ground layer L2 and the electric power supply layer L3 is 200 µm, that is, the thickness (t2) of the insulating material layer 52 is large. Therefore, it can be understood that the impedance of this board is higher than that of the other boards in the band from the low to the high frequency.

In the case of the board of sample B, the thickness (t2) of the insulating material layer 52 provided between the ground layer L2 and the electric power source layer L3 is 25 µm, that is, the thickness (t2) of the insulating material layer 52 is small. Therefore, it can be understood that the impedance is small in the band of the low frequency, that is, it can be understood that the impedance is low in the band in which the resonance frequency is not higher than about 100 MHz. However, the thickness (t1) of the insulating material layer 50 provided between the surface layer L1 and the ground layer L2 is 200 µm, that is, the thickness (t1) of the insulating material layer 50 is large. Therefore, it can be understood that the impedance is increased high by the component of the via inductance in the range exceeding the resonance frequency.

In the case of sample C, the thickness (t1) of the insulating material layer 50 provided between the surface layer L1 and the ground layer L2 is 80 µm, that is, the thickness (t1) of the insulating layer 50 is small, and the thickness (t2) of the insulating material layer 52 provided between the ground layer L2 and the electric power source layer L3 is 25 µm, that is, the thickness (t2) of the insulating material layer 52 is small. Therefore, the inductance of the vias is reduced, and it becomes possible to realize the low impedance even in the band of high frequency.

As can be seen in FIG. 9, the impedance of each sample at the frequency 1 GHz is shown as follows.

Sample A: 2.47 Ω
Sample B: 1.14 Ω
Sample C: 0.597 Ω

Figure 10:
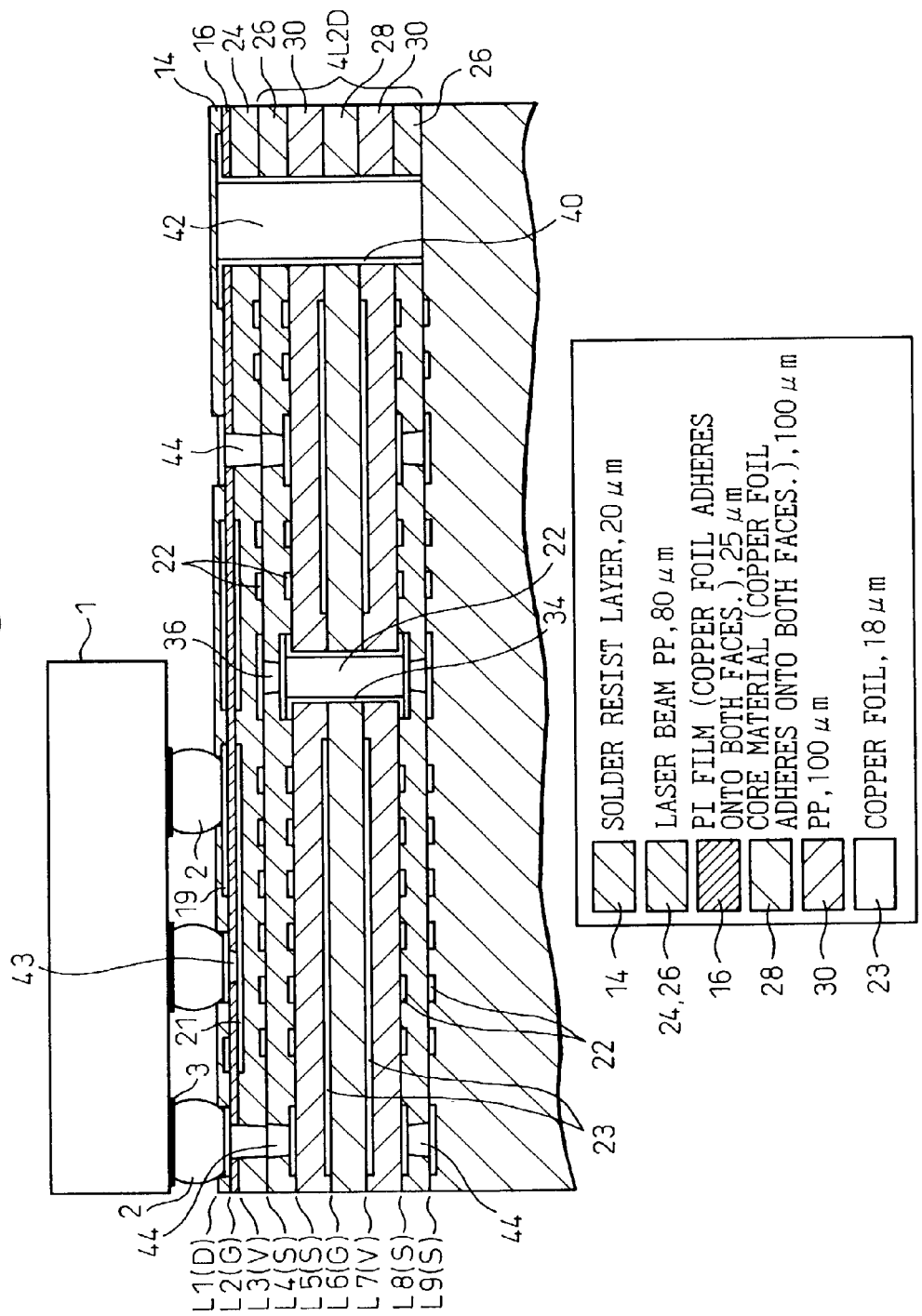
FIG. 10 is a sectional view of the second embodiment of the multilayer wiring circuit board of the present invention.

FIG. 10 is a sectional view of the multilayer wiring circuit board of the second embodiment of the present invention.

In the same manner as that of the first embodiment, concerning the semiconductor chip 1 mounted on the multilayer wiring circuit board of the second embodiment, it is possible to mount any of the bare chip, the ball grid array (BGA) type chip having bumps of the surface mounting type, the LGA type chip having no bumps and the part of QFA type having leads. FIG. 10 is a view showing an example in which the semiconductor chip 1 of the ball grid array (BGA) type having the solder bumps 2 is shown. The electrode pads 3 of this semiconductor chip 1 are connected with pad portions on the conductive pattern 19 provided on the multilayer wiring circuit board via the solder bumps 2.

The second layer L2 is formed as a ground layer. However, as described later, the conductive pattern connected with the electric power source layer and the signal layer is formed on this second layer. The third layer L3 is formed as an electric power source layer. On the contrary, the second layer L2 may be formed as an electric power source layer, and the third layer L3 may be formed as a ground layer. In this case, explanations will be made into a case in which the second layer L2 is a ground layer and the third layer L3 is an electric power source layer.

Between the uppermost surface layer L1 and the ground layer L2, there is provided a surface layer. Instead of the prepreg layer (insulating film) described in the first embodiment, which can be subjected to laser beam patterning, the surface layer is composed of the solder resist layer 14 in this embodiment. The thickness of this solder resist layer 14 is approximately 20 µm. Portions on this solder resist layer 14, in which the solder bumps 2 of the semiconductor chip 1 are joined, are open.

In the same manner as that of the first embodiment, as the material of the insulating film 16 provided between the ground layer L2 and the electric power source layer L3, it is preferable to use a polyimide film having a thermoplastic adhesion property on both sides. It is possible to use a polyimide film (laser PP) which can be subjected to laser beam patterning, for example, it is possible to use a polyimide film of about 15 µm thickness.

Concerning the solder resist layer 14 formed between the first layer L1, which is the uppermost surface layer, and the second layer L2, portions of the solder bumps 2 connected with the ground of the semiconductor chip 1, portions of the solder bumps 2 connected with the electric power source and portions of the solder bumps 2 connected with the signal pattern 22 are respectively open. Before the semiconductor chip 1 is mounted, the solder resist layer 14 is formed on the second layer L2. Pattern portions connected with the ground pattern 19, pattern portions connected with the electric power source pattern 21 through the conductive vias 43 and pattern portions connected with the signal pattern 22 through the conductive vias 44 are respectively exposed outside.

Accordingly, the conductive vias 43 are embedded in the through-holes provided on the insulating film 16 formed between the second layer L2 and the electric power source layer L3 which is the third layer, so that the second layer L2 and the third layer can be connected with each other. These through-holes are formed in such a manner that drilling is conducted on the insulating film 16 made of polyimide in the thickness direction by means of laser beam machining. When through-hole plating is conducted on the through-holes, the conductive vias 43 can be formed.

The structure of the layers from the electric power source layer L3, which is the third layer, to the ninth layer of this embodiment is the same as that of the first embodiment. The insulating films 24, 26, core material 28, copper foil 23 formed on both sides (L6, L7) of the core material 28 and prepreg layer 30 are the same as those of the first embodiment. Therefore, the explanations will be omitted here.

The through-holes 32 penetrating from the fifth layer L5 to the eighth layer L8, copper plating 34 provided in the inner faces of these through-holes 32, through-holes 40 and conductive vias 42 embedded in the through-holes 40 of this embodiment are the same as those of the first embodiment. Therefore, the explanations will be omitted here.

Figure 11:
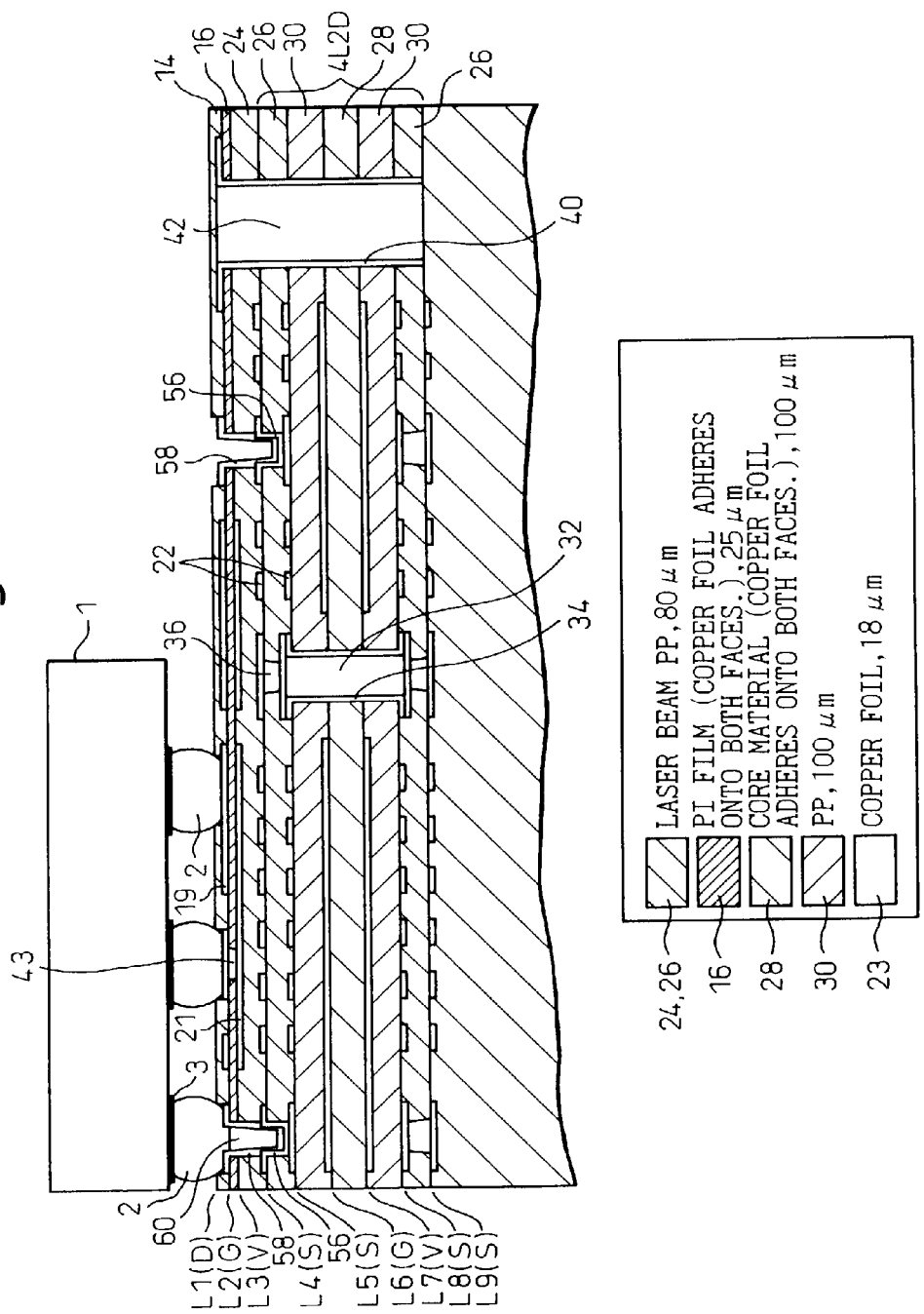
FIG. 11 is a sectional view of the third embodiment of the multilayer wiring circuit board of the present invention.

FIG. 11 is a sectional view of the multilayer wiring circuit board of the third embodiment of the present invention. The third embodiment is different from the second embodiment at the following points. In the second embodiment, the conductive vias 44 are charged into the through-holes between the second layer L2 and the fourth layer L4 and also into the through-holes between the fourth layer L4, which are connected with these through-holes, and the fifth layer L5. However, in this third embodiment, first, copper plating 56 is conducted in the through-holes between the fourth layer L4 and the fifth layer L5 so that the copper-plated portions can be formed into a cup-shape, and then the prepreg 24 capable of being subjected to laser beam machining is laminated. After that, through-holes are formed at positions corresponding to these through-holes by means of laser beam machining. Further, copper plating 58 is conducted in these through-holes so that the copper-plated portions can be formed into a cup-shape.

With respect to the through-holes at the portions with which the solder bumps 2 of the semiconductor chip 1 are connected, the conductive vias 60 are embedded in the cup-shaped copper-plated portions 58. On the other hand, with respect to the through-holes in the portions with which the solder bumps 2 of the semiconductor chips 1 are not connected, the cup-shaped copper-plated portions 58 are exposed outside.

In the production process of producing the multilayer circuit board of the second and the third embodiment shown in FIGS. 10 and 11, only different points from the production process of producing the multilayer circuit board of the first embodiment shown in FIGS. 2 to 7 will be explained as follows.

First, in the same manner as that of the first embodiment, there is prepared a multilayer circuit board having several 4L2D. In the third embodiment, with respect to 4L2D located at the uppermost portion and the lowermost portion of the laminated body, instead of charging the conductive vias 44 (shown in FIG. 2) as described before, the copper plating 56 is conducted in the corresponding through-holes so that the plated portions can be formed into a cup-shape.

Between a plurality of 4L2D which are a multilayer wiring circuit board, the core material layer 28, the thickness of which is approximately 100 µm, on both sides of which copper foil is made to adhere, is arranged at the center, and the prepreg layers 30, the thickness of which is approximately 100 µm, are arranged on both sides of the core material layer 28. The polyimide film 16, on both faces of which copper foil is made to adhere, only one face of which has been previously patterned, is arranged and laminated through the prepreg layer 30, which can be subjected to laser beam machining, in the uppermost portion and the lowermost portion of the laminated body while the patterned face (electric power source layer) is being set inside.

In the same manner as that shown in FIG. 4, laser beam machining, drilling and plating are conducted on the thus laminated multilayer wiring circuit board. Patterning is conducted on copper foil formed on the entire outer faces of the polyimide film 16 on the front and the reverse side of the laminated body (formation of the ground layer), and further the through-holes are formed by laser beam machining. These through-holes are formed at positions coinciding with the cup-shaped copper plating portions 56 which are formed in the through-holes exposed to the surface of 4L2D. In this way, these through-holes and the cup-shaped copper plating portions 56 are connected with each other. The new cup-shaped copper plating portions 58 are formed in the through-holes formed here.

Next, in FIG. 5, the build-up layers 14 are laminated on the uppermost and the lowermost face of the laminated body. In the first embodiment, this build-up layer 14 is composed of a prepreg layer of about 80 µm thickness on which laser beam machining can be conducted, and further the copper foil 48 of 18 µm thickness is laminated on the prepreg layer. However, in the second and the third embodiment, only the solder resist layer is formed. The thickness of this solder resist layer is approximately 20 µm.

When this solder resist layer 14 is formed, openings are formed so that the surface pattern can be exposed at predetermined positions of the connecting positions of the solder bumps 2 of the semiconductor chip 1 as described above.

Accordingly, in the second and the third embodiment, it is unnecessary to provide processes in which the copper foil 48 shown in FIG. 6 is subjected to laser beam machining, plating and patterning.

In the second and the third embodiment, concerning the copper wiring patterns 19, 21 formed on both faces of the polyimide film 16, one is formed as a ground layer, and the other is formed as an electric power source layer. A portion of the copper wiring pattern 19 on the upper side is connected with the other layer through the conductive vias or copper plating and also connected with the signal layer through the conductive vias or copper plating.

In any embodiment, both the ground layer and the electric power source layer can be arranged at the closest positions in the thickness direction of the multilayer wiring circuit board compared with the signal layer. Due to the foregoing, it becomes possible to reduce the inductance of the circuit, and the generation of noise in the high frequency region can be reduced.

In this connection, concerning the copper wiring patterns 21 provided on both faces of the polyimide film 16, either face may be the electric power source layer or the signal layer.

Figure 12:
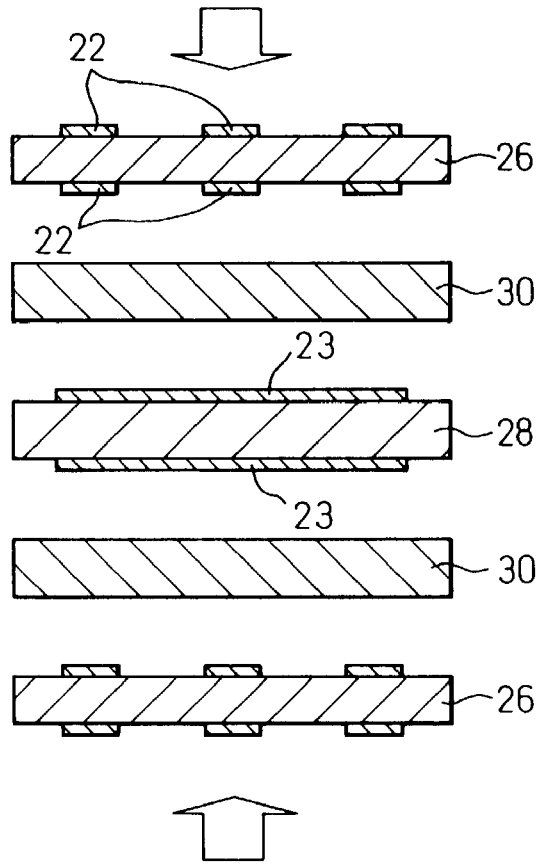
FIG. 12 is a view showing the formation of a multilayer circuit board (before lamination) executed by a lamination press process which is conducted all at once.
Figure 13:
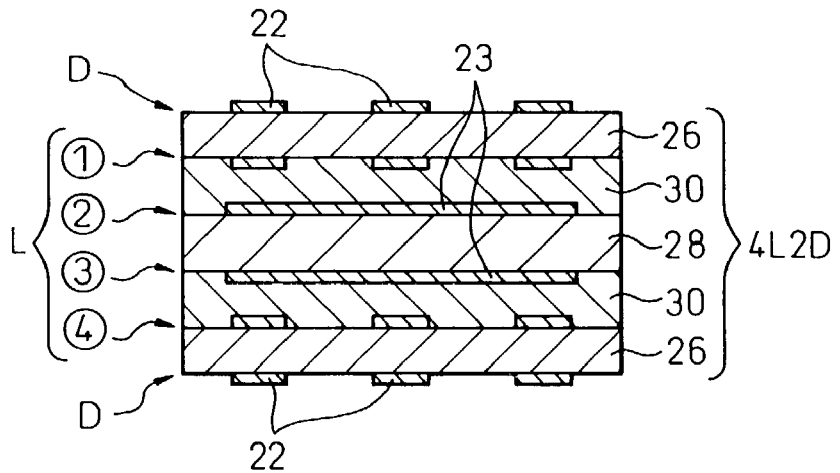
FIG. 13 is a view showing the formation of a multilayer circuit board (after lamination) executed by a lamination press process which is conducted all at once.

FIGS. 12 and 13 are views showing a method of forming the multilayer circuit board (4L2D) produced by the lamination press process which is conducted all at once. FIG. 12 is a view showing a state before lamination is conducted, and FIG. 13 is a view showing a state after lamination has been conducted. In this embodiment, the multilayer circuit board (4L2D) is produced as follows. The glass epoxy plate 28, on both faces of which copper foil is made to adhere, is arranged at the center. On both sides of the glass epoxy plate 28, the glass epoxy prepreg layers 30 are arranged. Further, on both sides of it, the glass epoxy plates, on both faces of which copper foil is made to adhere, is arranged. Positioning is conducted to each other, and then lamination is conducted by means of vacuum heating press forming so that the laminated layers can be integrated into one body.

The glass epoxy plate 28 having copper foil on both faces, which corresponds to the central core plate, is a glass epoxy plate, on both faces of which copper foil is made to adhere. In this case, the wiring pattern 23 has already been formed on the copper foil. In the embodiment described before, the layer is composed of a polyimide film. In this case, the glass epoxy prepreg 30 in a tack dry state is used. This embodiment uses the glass epoxy plate 26 having copper foil on both faces, on both faces of which the wiring patterns 22 have already been formed.

As described above, the lamination body of the multilayer wiring board shown in FIG. 13 is made, and then the layers are connected with each other by means of drilling and plating.

In this connection, in the structure shown in FIG. 12 in which copper foil is made to adhere onto both faces of the resin film (glass epoxy resin film), a boundary face between the resin film and the copper foil is a rough face, the surface roughness of which is usually 2 to 3 µm (not shown in the drawing). When the thickness of the resin film is approximately 30 µm, insulation between the layers of copper foil (conductive pattern) formed on both faces of the resin film can be sufficiently ensured. However, in the case of usual glass epoxy resin impregnated with glass cloth, when the thickness is decreased more than the value described above, the insulation property is deteriorated. In the case where one of the copper foil layers (conductive patterns) formed on both faces of the insulation film is a ground layer and the other is an electric power source layer, voltage is impressed at all times, and further areas of the copper foil layers provided on both faces are relatively large. Accordingly, there is a possibility of the occurrence of migration.

In order to compensate the insulation property between these copper foil layers, a solid film-shaped resin is inserted, and an adhesive layer of epoxy resin is provided between the copper foil layer and this solid film-shaped resin. In this case, the solid film-shaped resin is made of material of a low dielectric constant such as polyimide or aramid, the thickness of which is approximately 4 μm.

Referring to the accompanying drawings, some embodiments of the present invention have been explained above. However, it should be noted that the present invention is not limited to the above specific embodiments, but any modification or but variations may be made by a person skilled in the art without departing from the spirit and scope of the invention.

The invention claimed is:

1. An organic multilayer wiring circuit board comprising:
    a signal layer;
    a first insulating resin layer arranged on the signal layer;
    a lamination body arranged on the first insulating resin layer, the lamination body includes: an electric power layer, a ground layer; and a second insulating polyimide layer provided between the electric power layer and the ground layer, the second insulating polyimide layer having a thickness of 4 to 25 μm, the second insulating polyimide layer having a thermoplastic adhesive property on both faces;
    a third insulating resin layer arranged on the lamination body, the third insulating resin layer having a thickness of 80 micron or less; and
    an uppermost conductive layer arranged on the third insulating resin layer, on which electronic parts are mounted;
    wherein the electronic parts mounted on said uppermost conductive layer comprise at least one device which operate at a switching frequency greater than 100 MHz.

2. The wiring circuit board according to claim 1, wherein a patterning is conducted on the second insulating polyimide layer.

3. The wiring circuit board according to claim 2, Wherein the patterning is a laser beam patterning.

4. The wiring circuit board according to claim 1, wherein the uppermost conductive layer and electric power source layer are connected with each other by embedded vias and also the uppermost conductive layer and ground layer are connected with each other by embedded vias.

5. The wiring circuit board according to claim 1, wherein embedded vias are formed so as to extend in a thickness direction perpendicular to the direction of the layer of the board between the uppermost conductive layer and the ground layer, and also between the uppermost conductive layer and the electric power source layer.

6. The wiring circuit board according to claim 5, wherein a sectional area of the embedded via is made to be relatively large so as to reduce the inductance.

7. The wiring circuit board according to claim 1, wherein the organic multilayer wiring circuit board is composed of a plurality of layers, the number of which is not less than eight.

8. The wiring circuit board according to claim 1, wherein the second insulating polyimide layer has a thickness of about 15 μm.

9. The wiring circuit board according to claim 1, wherein the second insulating polyimide layer has a thickness of about 25 μm.

* * * * *